United States Patent [19]
Suzuki et al.

[11] Patent Number: 4,653,023
[45] Date of Patent: Mar. 24, 1987

[54] PLURAL-BIT-PER-CELL READ-ONLY MEMORY

[75] Inventors: Yasuo Suzuki, Yokohama; Hiroshi Hirao; Yasuaki Suzuki, both of Kawasaki, all of Japan

[73] Assignee: Fujitsu Limited, Kawasaki, Japan

[21] Appl. No.: 651,364

[22] Filed: Sep. 17, 1984

[30] Foreign Application Priority Data

Sep. 16, 1983 [JP] Japan .................................. 58-170794
Sep. 30, 1983 [JP] Japan .................................. 58-182012

[51] Int. Cl.[4] ...................... G11C 11/56; G11C 17/00; H01L 27/10
[52] U.S. Cl. ................................. 365/104; 365/168; 365/210
[58] Field of Search ............... 365/210, 104, 189, 178, 365/168, 184; 357/23.12

[56] References Cited

U.S. PATENT DOCUMENTS 4,415,992 11/1983 Adlhoch ............................ 365/210
4,449,203  5/1984 Adlhoch ............................ 365/104
4,503,518  3/1985 Iwahashi ........................... 365/210

OTHER PUBLICATIONS

Electronics International, vol. 56, No. 6, Mar. 24th, 1983, pp. 121-123, New York, US; B. Donoghue et al.; "Variable Geometry Packs 2 Bits Into Every ROM Cell" *Figures 1, 3*.
Electronics International, vol. 55, No. 11, Jun. 2nd, 1982, pp. 141-145, New York, US; F. A. Scherpenberg et al.; "Asynchronous Circuits Accelerate Access to 256-K Read-Only Memory" *Figures 1; p. 142, lines 8-12*.
J. A. Bayliss et al., "The Interface Processor for the Intel VLSI 423 32-Bit Computer", *IEEE Journal of Solid-State Circuits*, vol. SC-16, No. 5, Oct. 5, 1981.

Primary Examiner—James W. Moffitt
Assistant Examiner—Glenn A. Gossage
Attorney, Agent, or Firm—Armstrong, Nikaido, Marmelstein & Kubovcik

[57] ABSTRACT

A plural-bit-per-cell read-only memory constituted by a memory cell array (1), reference cell array (2A, 2B, 2C), and related circuits. In the memory cell array (1), a low resistance ground line (17) crossing the diffusion layer in parallel with the bit lines (15) is arranged for each predetermined length of the diffusion layer, which is used as a common grounding route to the low resistance ground line (17). The reference cell array (2A) includes a plurality of reference cells (211, 212, ... 21n), and the arrangement of the reference cells (211, 212, ... 21n) corresponds to the arrangement of the plural-bit memory cells (14) within the predetermined length of the diffusion layer in the memory cells array (1). The transconductance of the reference cells is predetermined in correspondence with the reference voltage values (REF1, REF2, REF3). A column address signal which selects a plural-bit memory cell (14) also selects one of the reference cells (211, 212, ... 21n) which corresponds to the plural-bit memory cell (14) selected by the column address signal. Thus, in generation of reference voltages (REF1, REF2, REF3), the reference voltage value is corrected taking into consideration the influence of resistance of the diffusion layer according to the location of the plural-bit memory cell (14) selected by the column address signal.

1 Claim, 15 Drawing Figures

PLURAL-BIT-PER-CELL READ-ONLY MEMORY

BACKGROUND OF THE INVENTION (1) Field of the Invention

The present invention relates to a read-only memory (ROM) of the plural-bit-per-cell type.

(2) Description of the Prior Art

Usually, in a ROM memory cell array, one cell stores one-bit information "0" or "1". To double the memory capacity with the same number of cells, it has been proposed to design cells which can store two-bit information "00", "01", "10", or "11".

To realize a memory cell capable of storing plural-bit information, memory cell transistors having different transconductances gm are generally used. The different transconductances correspond to the different kinds of information 00, 01, 10, and 11.

In a memory cell array including memory cell transistors having different transconductances, when the bit lines are connected to a voltage source and one pair of a word line and a bit line is selected to select a particular memory cell, the potential of the bit line to which that memory cell is connected becomes one of four potentials corresponding to the different transconductances.

The potential of the bit line to which the memory cell is connected is compared with three reference potentials, corresponding to intermediate values of the above-mentioned four potentials. From the result of such a comparison, it is possible to determine the information stored in the memory cell.

Setting the above-described reference potentials is difficult, however, since the potential of the bit line to which the memory cell is connected may vary in accordance with the location of the bit line. Such variation is caused by a voltage drop in the grounding route diffusion layer due to the parasitic resistance in the grounding route diffusion layer. As a result, plural-bit-per-cell ROM's suffer from occasional erroneous reading of the information stored in the memory cell and cannot enjoy sufficient operation margins.

An example of a plural-bit-per-cell ROM is described in J. A. Bayliss et al. "The Interface Processor for the Intel VLSI 423 32-Bit Computer", IEEE Journal of Solid-State Circuits Vol. SC-16, No. 5, October 1981.

SUMMARY OF THE INVENTION

It is an object of the present invention to provide an improved ROM of the plural-bit-per-cell type in which the information stored in the cells is correctly read and the operation margin of the ROM is increased, despite significant parasitic resistance in the grounding route diffusion.

According to the present invention, there is provided a plural-bit-per-cell ROM having a memory cell array consisting of a plurality of plural-bit memory cells and a reference cell array for producing voltages used for reading the data stored in the plural-bit memory cells.

The memory cell array includes a pattern of diffusion layers formed on a substrate, a predetermined number of parallel bit lines crossing the diffusion layers per predetermined length of the diffusion layers, a plurality of plural-bit memory cells comprising transistors formed at the intersections of the diffusion layers and the bit lines, and low resistance ground lines crossing the diffusion layers in parallel with the bit lines, one low resistance ground line being arranged per the predetermined length of the diffusion layers. The predetermined length of the diffusion layers is used as a common grounding route to the ground line. A plurality of word lines cross the bit lines and connect to the gates of the plural-bit memory cells. The bit lines and the word lines are used for the selection from the plural-bit memory cells.

The reference cell array includes a plurality of reference cells with a transistor structure. The arrangement of the reference cells corresponds to the arrangement of the plural-bit memory cells within the predetermined length of the diffusion layer in the memory cell array. The transconductance of the reference cells is predetermined in correspondence with reference voltage values. A column address signal which selects a plural-bit memory cell also selects a reference cell which corresponds to the selected plural-bit memory cell. Thus, a reference voltage is generated with the reference voltage value corrected in consideration of the influence of the resistance of the diffusion layer according to the location of the selected plural-bit memory cell.

BRIEF DESCRIPTION OF THE DRAWINGS

In the drawings,

FIGS. 5, 5A, 5B and 5C show a plural-bit-cell ROM according to an embodiment of the present invention;

DESCRIPTION OF THE PREFERRED EMBODIMENTS

Figure 1:
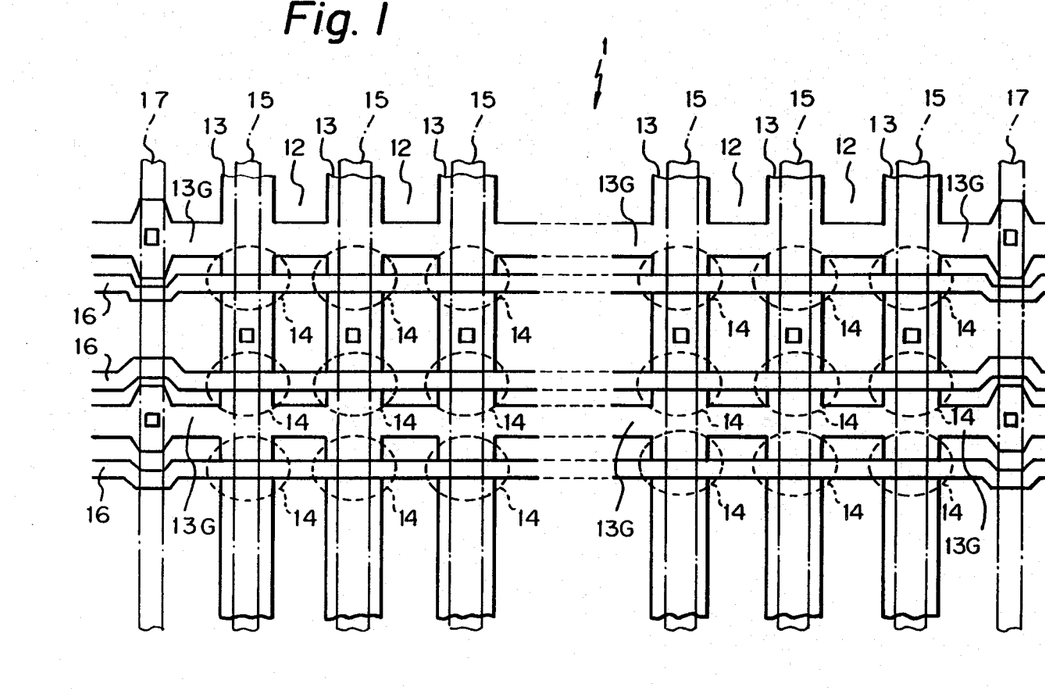
FIG. 1 shows a pattern of a memory cell array to which the present invention is applied.
Figure 2:
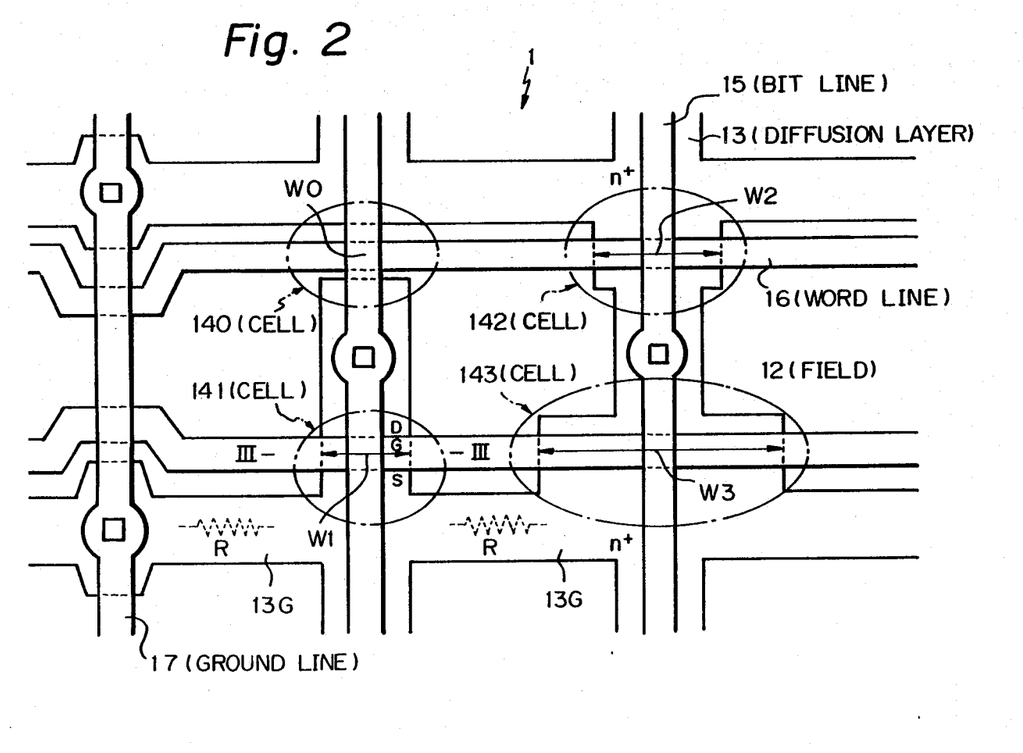
FIG. 2 shows details of the pattern shown in FIG. 1.

A pattern of a memory cell array to which the present invention is applied is illustrated in FIGS. 1 and 2, FIG. 2 illustrating details of the pattern in FIG. 1. The memory cells in the array are plural-bit memory cells of a transistor structure.

The pattern of a memory cell array is formed on a substrate. The pattern includes an $SiO_2$ field 12, diffusion layers 13, memory cells 14, bit lines 15, word lines 16, grounding route diffusion layers 13G, and ground lines 17.

As illustrated in FIG. 2, each of the transistor-structure memory cells 140, 141, 142, and 143 consists of a source S, a drain D, and a gate G. The source S and the drain D are formed by the diffusion layer 13. The gate G is formed by the word line 16.

The widths of the gates of memory cells 140, 141, 142, and 143 are $W_0$, $W_1$, $W_2$, and $W_3$, for example, $W_0=0$, $W_1=2$ μm, $W_2=3$ μm, and $W_3=4$ μm. In the case where $W_0=0$, no substantial transistor exists.

Figures 3, 4:
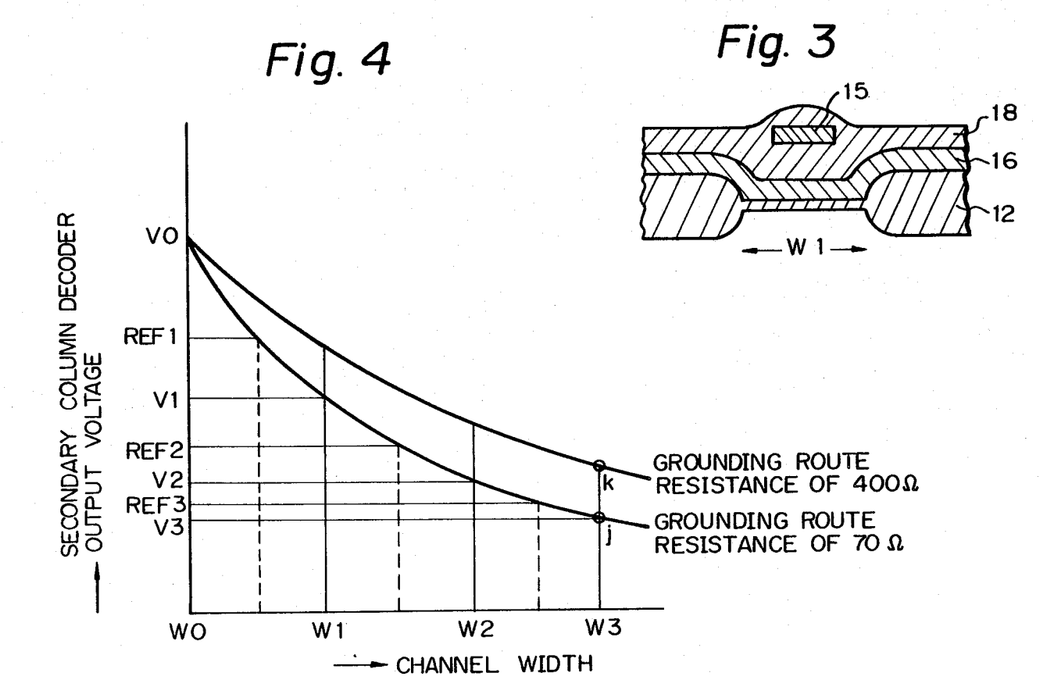
FIG. 3 shows the cross-sectional structure of one of the memory cells along line III—III in FIG. 2.
FIG. 4 shows the characteristic of the reading of information from the memory cell array shown in FIG. 1.

The cross-sectional structure of one of the memory cells 14 along line III—III in FIG. 2 is shown in FIG. 3. In FIG. 3 are illustrated an $SiO_2$ field 12, a word line 16 of polycrystalline silicon as a gate, a bit line 15 of aluminum, and a layer 18 of phosphosilicate glass.

In correspondence with the difference in the widths of the gates $W_0$, $W_1$, $W_2$, and $W_3$, memory cells having different transconductances gm0, gm1, gm2, and gm3 are obtained. It is possible to make these different transconductances gm0, gm1, gm2, and gm3 correspond to a plurality of plural-bits "00", "01", "10", and "11".

When a power source voltage is applied to the bit lines and a memory cell is selected by a word line, the potential of the bit line becomes equal to one of the four potentials corresponding to the four transconductances gm0, gm1, gm2, gm3. It is possible to identify the value of the plural bit information of the memory cell by comparing the potential of the bit line to which the memory cell is connected with three reference voltages (REF1, REF2, REF3), corresponding to intermediate potentials between the above-mentioned four potentials.

In the memory cell array shown in FIG. 2, attention should be paid to the parasitic resistance R in the grounding route diffusion layers 13G. Because of the voltage drop across the parasitic resistance R, the potential of the bit line of the selected memory cell varies. The further the bit line 15 from the ground line 17, the greater the voltage drop due to the parasitic resistance R in the grounding route diffusion layer 13G.

One ground line 17 is provided per n bit lines 15. Therefore, for example, when n is 16, the width of the grounding route diffusion layers 13G is 2 μm, and the sheet resistance of the diffusion layers is 40 Ω per square, the resistance of the grounding route ranges from a minimum value of 70 Ω to a maximum value of 400 Ω.

The relationship between the output of a column decoder for a memory cell array and the channel width of a memory cell in the prior art is illustrated in FIG. 4, taking the resistance of the grounding route as a parameter. It will be understood that, under the minimum grounding route resistance (70 Ω), the point j, which represents the output voltage corresponding to the channel width W3, is detected as lower than the reference voltage REF3, while under the maximum grounding route resistance (400 Ω), the point k, which represents the output voltage corresponding to the channel width W3, is detected as higher than the reference voltage REF3. Such a difference in detection causes the problem of erroneous operation, as mentioned earlier.

Figure 5A:
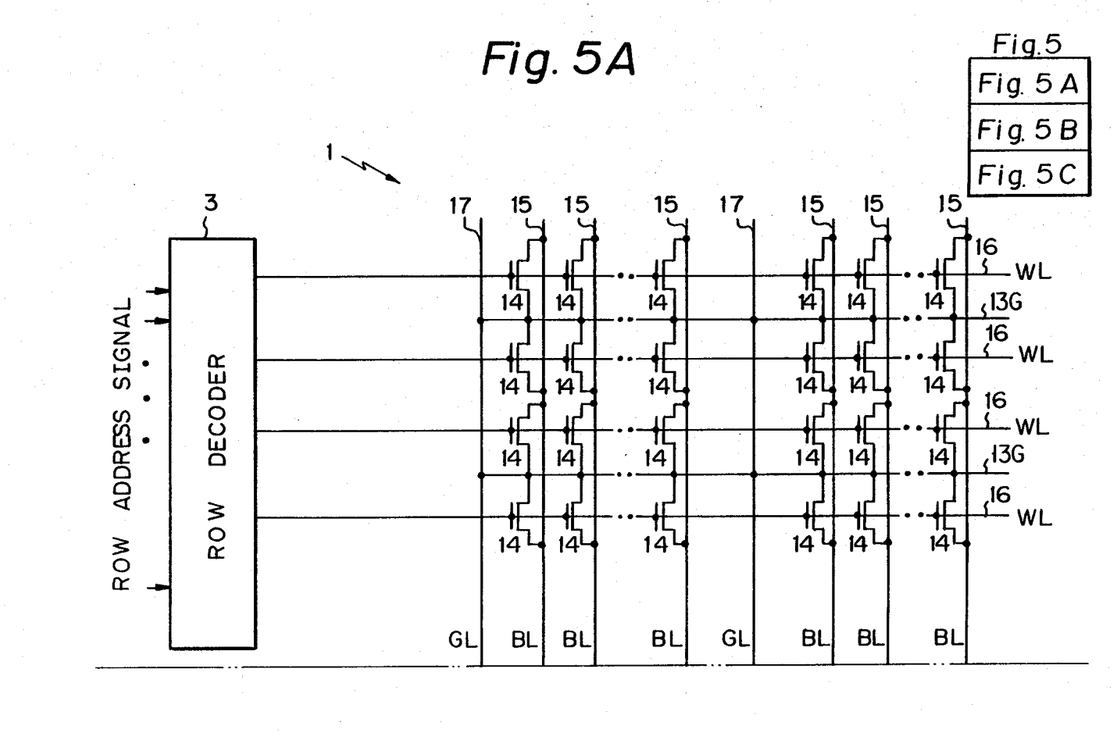
Figure 5B:
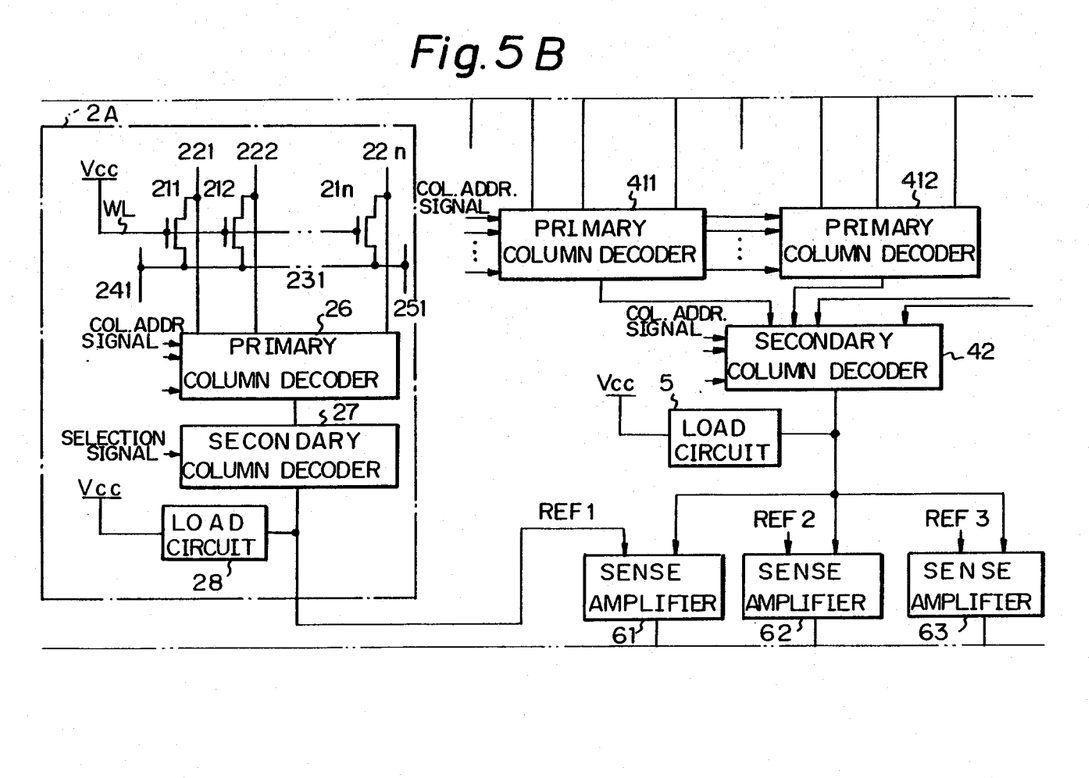
Figure 5C:
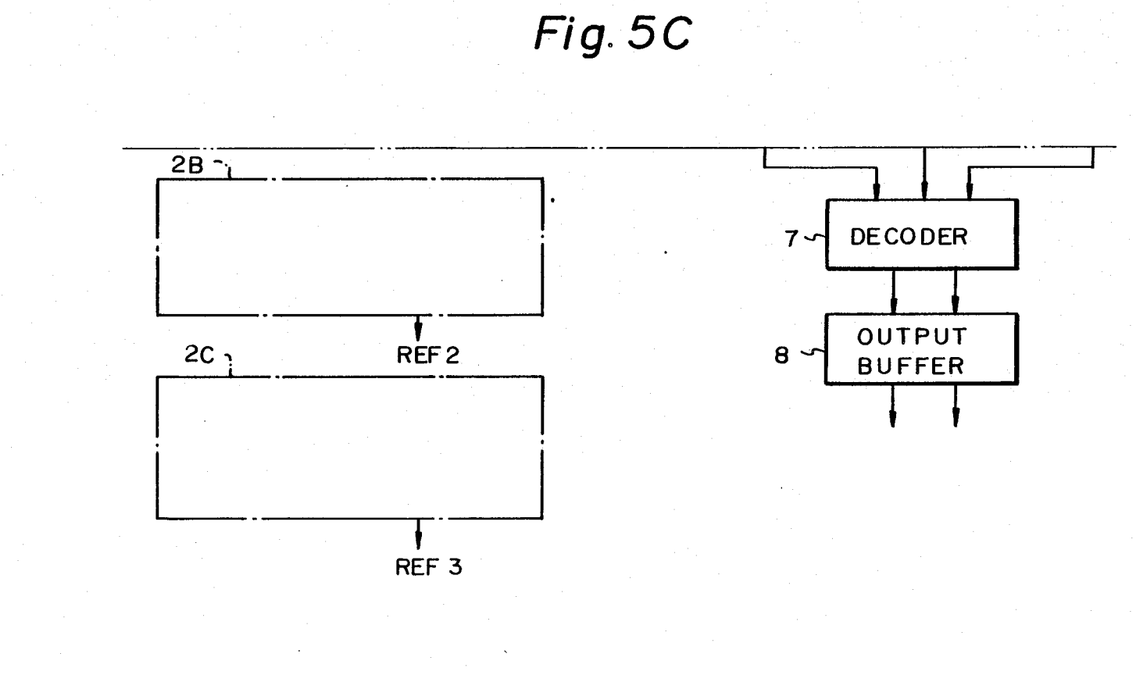
Figure 6:
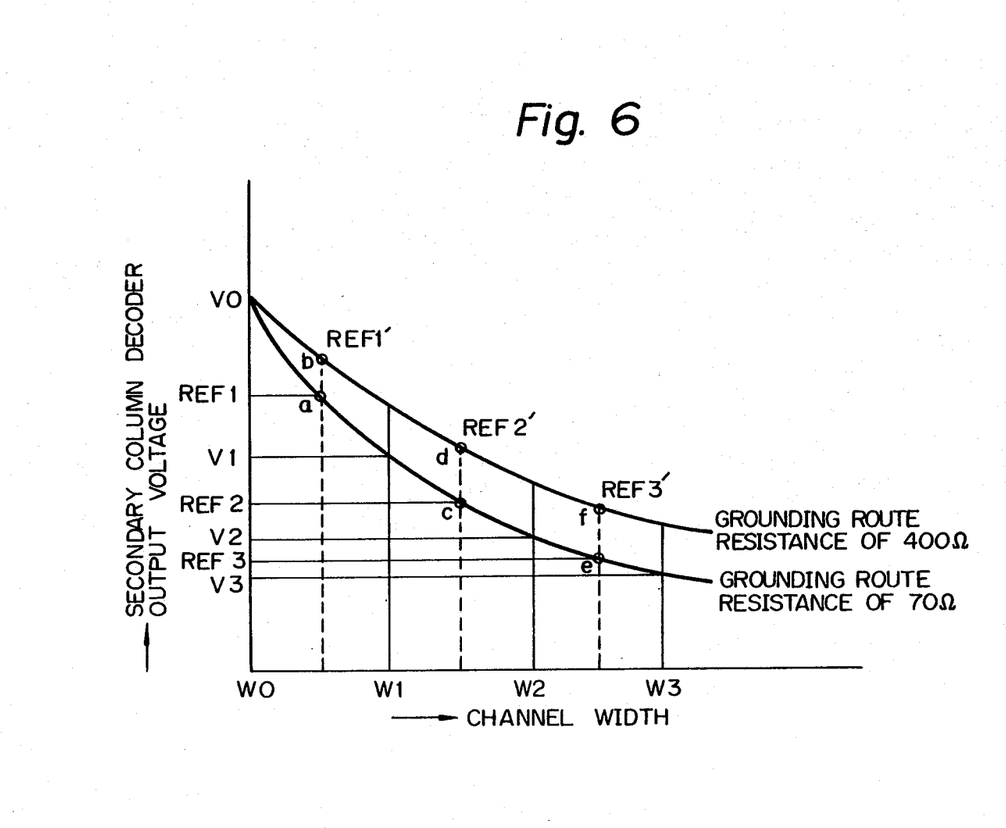
FIG. 6 shows the characteristic of the reading of information from the memory cell array in the device shown in FIGS. 5–5C.

A plural-bit-per-cell ROM according to an embodiment of the present invention is shown in FIGS. 5-5C. The operation characteristic of the device is FIGS. 5-5C is illustrated in FIG. 6.

The device of FIGS. 5-5C includes a memory cell array 1, a reference cell array 2 (2A, 2B, 2C), a row decoder 3, primary column decoders 411, 412, ..., a secondary column decoder 42, a load circuit 5, sense amplifiers 61, 62, and 63, a decoder 7, and an output buffer 8.

The memory cell array 1 includes memory cells 14, bit lines (BL) 15, word lines (WL) 16, grounding route diffusion layers 13G, and ground lines (GL) 17. Section 2A of the reference cell array 2 includes a plurality of reference cells 211, 212, ... 21n, bit lines 221, 221, ... 22n, a grounding route diffusion layer 231, ground lines 241 and 251, a primary column decoder 26, a secondary column decoder 27, and a load circuit 28.

Upon receipt of a row address signal, the row decoder 3 selects one of the word lines 16. Each of the groups of n bit lines is connected to one of the primary column decoders (411, 412, ... 41n). Upon receipt of a column address signal, the primary column decoders 411, 412, ... select one of the n bit lines. Upon receipt of the column address signal, the secondary column decoder 42 selects one of the groups of bit lines.

The output terminal of the second column decoder 42 is connected to the load circuit 5 and the sense amplifiers 61, 62, and 63.

Reference voltages REF1, REF2, and REF3 are supplied to the sense amplifiers 61, 62, and 63, respectively.

The decoder 7 detects the plural-bit information stored in the memory cell in question from the input signals supplied from the sense amplifiers 61, 62, and 63. The output of the decoder 7 is supplied to the output buffer 8. The output buffer delivers an output signal indicating plural bits, for example, one of "00", "01", "10", and "11".

The operation of the sense amplifier 61, 62, 63, the decoder 7, and the output buffer 8 is as follows. The output of the secondary column decoder 42 is compared with the reference voltages REF1, REF2, and REF3 in the sense amplifiers 61, 62, and 63.

It is assumed that, when the voltage of the input signal from the secondary column decoder 42 is higher than the reference voltage REF1, the sense amplifier 61 delivers an output having a LOW potential, while when the voltage of the input signal from the secondary column decoder 42 is lower than reference voltage REF1, the sense amplifier 61 delivers an output having a HIGH potential.

Under such an assumption, when a memory cell having the channel width $W_0$, corresponding to information "00", is addressed, the potentials of the outputs of the sense amplifiers 61, 62, and 63 are all LOW, so that the output buffer 8 delivers information "00". When a memory cell having the channel width W1, corresponding to information "01", is addressed, the potentials of outputs of the sense amplifiers 61, 62, and 63 are HIGH, LOW, and LOW, so that the output buffer 8 delivers information "01". When a memory cell having the channel width W2, corresponding to information "10", is addressed, the potentials of outputs of the sense amplifiers 61, 62, and 63 are HIGH, HIGH, and LOW, so that the output buffer 8 delivers information "10". When a memory cell having the channel width W3, corresponding to information "11", is addressed, the potentials of outputs of the sense amplifiers 61, 62, and 63 are all HIGH, so that the output buffer 8 delivers information "11".

The reference voltage in section 2A of the reference cell array is produced in such a way as to prevent erroneous detection operation of the sense amplifiers due to the variation in the potentials of the output signal from the secondary column decoder 42.

The reference cells 211, 212, ... 21n are the transistors constituted similar to the group of n memory cells in memory cell array 1, except that the widths of the gates of the reference cells 211, 212, ... 21n are the same.

The structures of sections 2B and 2C of the reference cell array 2 are the same as the structure of section 2A, except for the difference in the widths of the gates of the reference cells. Section 2A has a gate width $W(2A)=\frac{1}{2}(W_0+W_1)$, section 2B a gate width $W(2B)=\frac{1}{2}(W_1+W_2)$, and section 2C a gate width $W(2C)=\frac{1}{2}(W_2+W_3)$.

The voltage $V_{CC}$ is supplied continuously to the gates of the reference cells 211, 212, ... 21n.

The same column address signal as that supplied to the primary and secondary column decoders 411 and 42 is supplied to the primary column decoder 26. A selection signal is continuously supplied to the secondary column decoder 27 to realize the same state of current path as in the memory cell array 1. The secondary column decoder 27 is provided for maintaining a balance with the memory cell array 1.

The output voltage of section 2A of the reference cell array depends on the current passing from the voltage source $V_{CC}$ through the load circuit 28, the secondary column decoder 27, the primary column decoder 26, one of the reference cells which is selected by the column address signal supplied to the primary column decoder 26, the grounding route diffusion layer 231, and the ground lines 241 and 251. The voltage drop in the grounding route diffusion layer 231 varies in correspondence with the selection of the reference cell. Hence, the output voltage REF1 varies accordingly.

In correspondence with the change in the parasitic resistance R in the grounding route diffusion layer 231 from the minimum value of, for example, 70 Ω to the maximum value of, for example, 400 Ω, the reference voltage REF1 produced from section 2A of the reference cell array 2 is changed from point a (REF1) to point b (REF1') as illustrated in FIG. 6.

The reference voltages REF2 and REF3 produced from sections of the 2B and 2C reference cell array 2 are similarly changed from points c (REF2) and e (REF3) to points d (REF2') and f (REF3'), respectively, as illustrated in FIG. 6.

Thus, in accordance with the device shown in FIGS. 5–5C, the reference voltage is changed in correspondence with the position of the selected memory cell so that the unfavorable effect of the voltage drop in the grounding route diffusion layer is eliminated. Accordingly, correct reading of the plural-bit data stored in the memory cell is carried out.

Figure 7:
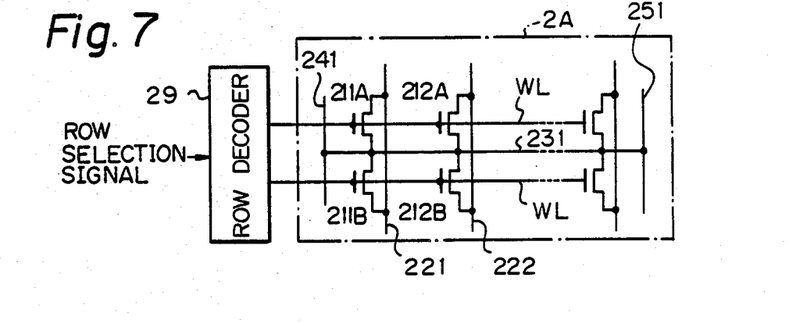
FIG. 7 shows an example of the arrangement of the reference cell array.

It is possible to use the arrangement shown in FIG. 7 of the reference cell array in place of the arrangement 211, 212, ... 21n of the reference cell array shown in FIG. 5B.

In the arrangement shown in FIG. 7, not only the cells 211A, 212A, ... 21nA located at one side of a word line, but also the cells 211B, 212B, ... 21nB located at the other side are used in the reference cell array.

When a memory cell located at the above-mentioned one side of the word line is selected, the word line for the reference cells 211A, 212A, ... 21nA is selected by the row decoder 29 due to the row selection signal. When a memory cell located at the above-mentioned other side of the word line is selected, the word line for the reference cells 211B, 212B, ... 21nB is selected by the row decoder 29 due to the row selection signal.

Figure 8:
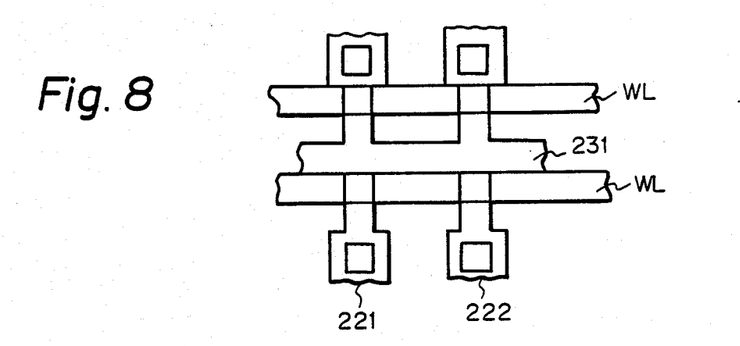
FIGS. 8 and 9 llustrate the reason for the use of the arrangement of the reference cell array shown in FIG. 7.
Figure 9:
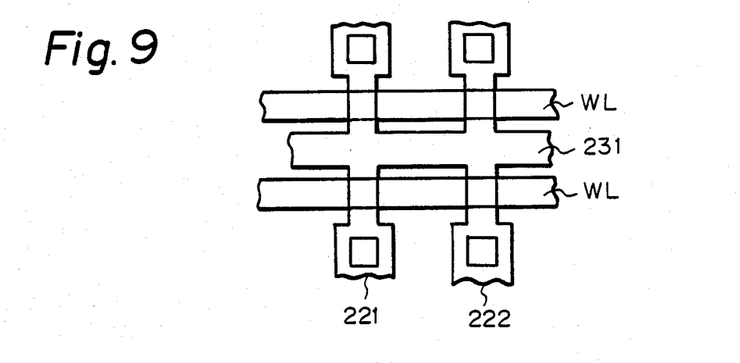

The reason for the use of the arrangement shown in FIG. 7 is as follows. In the manufacture of a memory cell array and reference cell array using the mask alignment process, sometimes the word lines WL are formed at positions as shown in FIG. 8 shifted with respect to the diffusion layer 231 from the normal positions as shown in FIG. 9. Such a shifted arrangement results in characteristics of the memory cell transistors 211A, 212A, ... 21nA different from the characteristics of the memory cell transistors 211B, 212B, ... 21nB, which has an unfavorable effect on obtaining a suitable reference voltage from the reference cell array.

The above-described shifting of word lines occurs similarly both in the memory cell array and in the reference cell array. Therefore, the arrangement of the reference cell array is used together with the row decoder for reducing the unfavorable effect.

Figure 10:
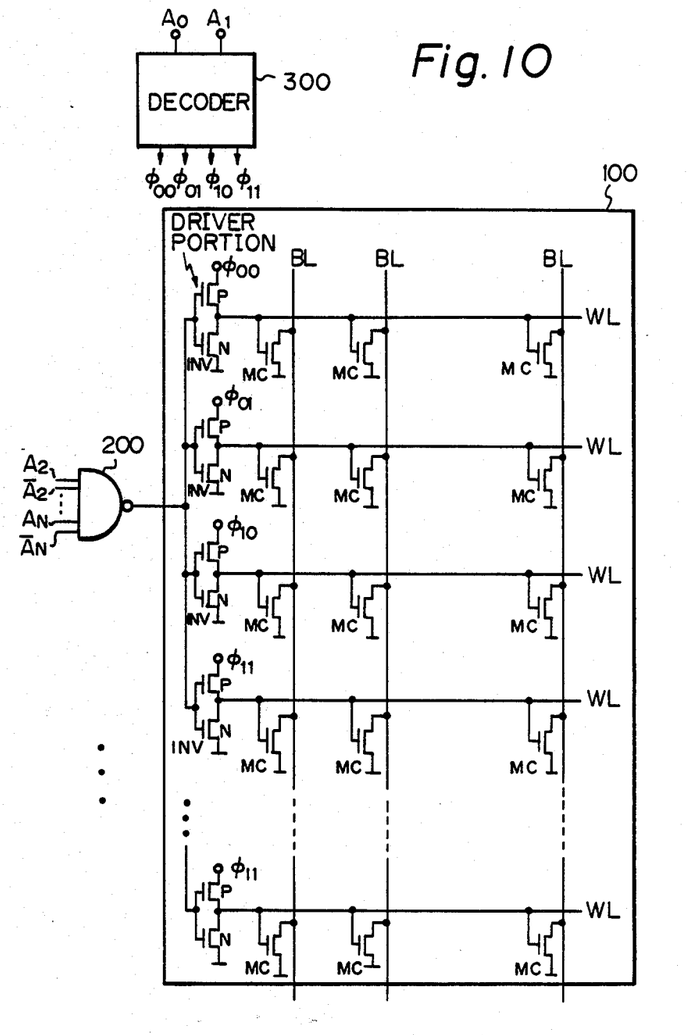
FIGS. 10, 11, 11A and 11B show another embodiment used in place of the memory cell array included in the ROM shown in FIGS. 5–5C.
Figures 11, 11A:
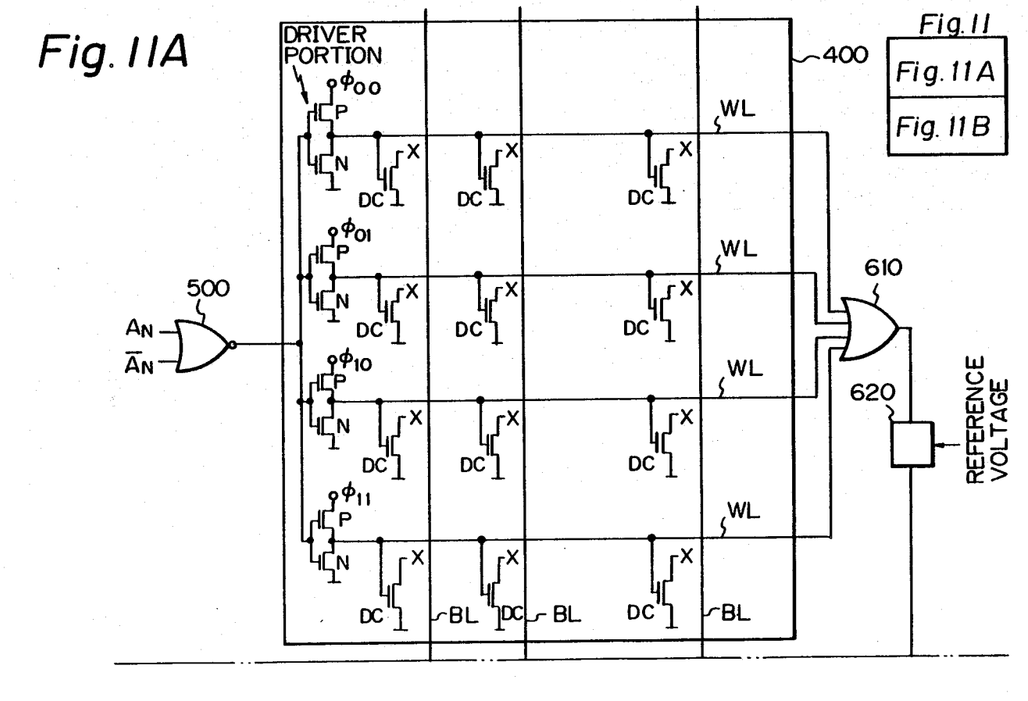
Figure 11B:
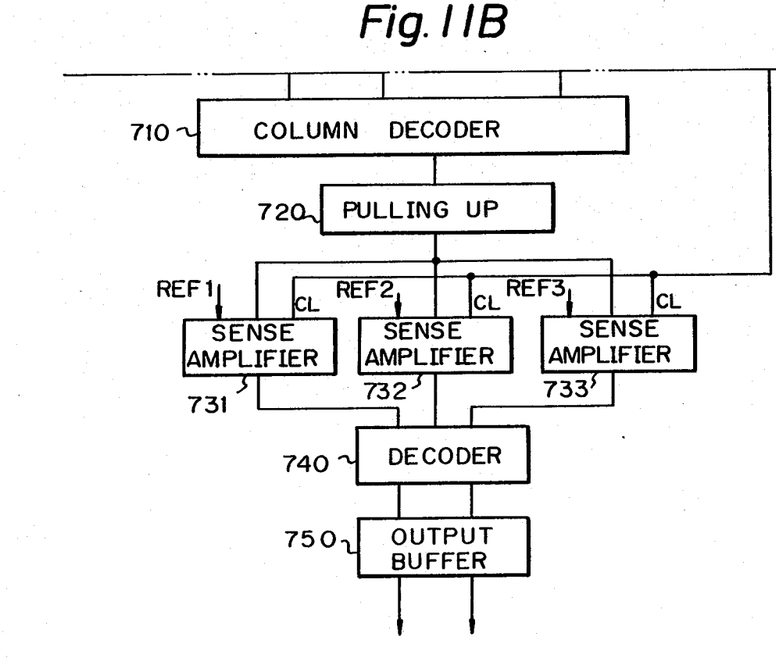

As another example of a device for reading the data stored in a plural-bit-per-cell ROM, a device constituted by the device shown in FIG. 10 and the device shown in FIGS. 11–11B is used in place of the memory cell array included in the ROM shown in FIG. 5–5C, i.e., a combination of the device including the memory cell (real cell) array 100 shown in FIG. 10 and the device including the dummy cell array 400 shown in FIG. 11A is used.

The real cell array 100 includes bit lines BL, word lines WL, memory cells MC, and a driver portion. The driver portion consists of inverters. Each of the inverters consists of a P-channel transistor and an N-channel transistor.

The input terminal of the driver portion is connected to the output terminal of a NAND gate 200.

The output signals $\phi_{00}$, $\phi_{01}$, $\phi_{10}$, and $\phi_{11}$ of the decoder 300 are supplied to the sources of the P-channel transistors of the driver portion of the real cell array 100. The decoder 300 decodes the address signals $A_0$ and $A_1$ supplied to the decoder 300 to make the potential of one of the output signals $\phi_{00}$, $\phi_{01}$, $\phi_{10}$, $\phi_{11}$ HIGH. That is, when both of the potentials of $A_0$ and $A_1$ are LOW, the potential of $\phi_{00}$ is HIGH; when both of the potentials of $A_0$ and $A_1$ are HIGH, the potential of $\phi_{11}$ is HIGH; while when the potentials of one of $A_0$ and $A_1$ is HIGH and the potential of the other of $A_0$ and $A_1$ is LOW, one of the potentials of $\phi_{01}$ and $\phi_{10}$ is HIGH.

The dummy cell array 400 includes bit lines BL, word lines WL, dummy cells DC, and a driver portion. The driver portion consists of inverters. Each of the inverters consists of a P-channel transistor and an N-channel transistor.

The input terminal of the driver portion is connected to the output terminal of a NOR gate 500. The output signals $\phi_{00}$, $\phi_{01}$, $\phi_{10}$, and $\phi_{11}$ of the decoder 300 are also supplied to the sources of the P-channel transistors of the driver portion of the dummy cells array 400.

Dummy cells DC are arranged at the intersections of the bit lines BL and the word lines WL. The dummy cell DC is an N-channel transistor having the maximum channel width. The gate of the dummy cell DC is connected to a word line WL. The source of the dummy cell DC is connected to the potential $V_{SS}$. The drain of the dummy cell DC is in the OPEN state (X).

The four of the word lines WL are connected to the input terminals of an OR gate 610. The output terminal of the OR gate 610 is connected to a detector 620 to which a reference voltage is supplied. The output of the detector 620 is supplied to the clock input terminal CL of the sense amplifiers 731, 732, and 733.

The bit lines BL of the real cell array 100 are connected through the bit lines BL of the dummy cell array 400 to a column decoder 710. The output of the column decoder 710 is supplied to a pulling-up circuit 720. The output of the pulling-up circuit 720 is supplied to the sense amplifiers 731, 732, and 733. The outputs of the sense amplifiers 731, 732, and 733 are supplied to a decoder 740. The output of the decoder 740 is supplied to an output buffer 750 which delivers the output signal indicating plural bits.

In the device constituted by the combination of the device shown in FIG. 10 and the device shown in FIGS. 11-11B, the driver portion in the real cell array 100 corresponds to the driver portion in the dummy cell array 400. The detection circuit consisting of the OR gate 610 and the detector 620 detects the potential of the word line in question in the dummy cell array. The potential of the output of the OR gate 610 is compared with a reference voltage in the detector 620. The output of the detection circuit is supplied to the sense amplifiers 731, 732, and 733. Hence, the sense amplifiers 731, 732, and 733 are driven only when the potential of the word line in question in the dummy cell array is within a predetermined range.

Figure 12:
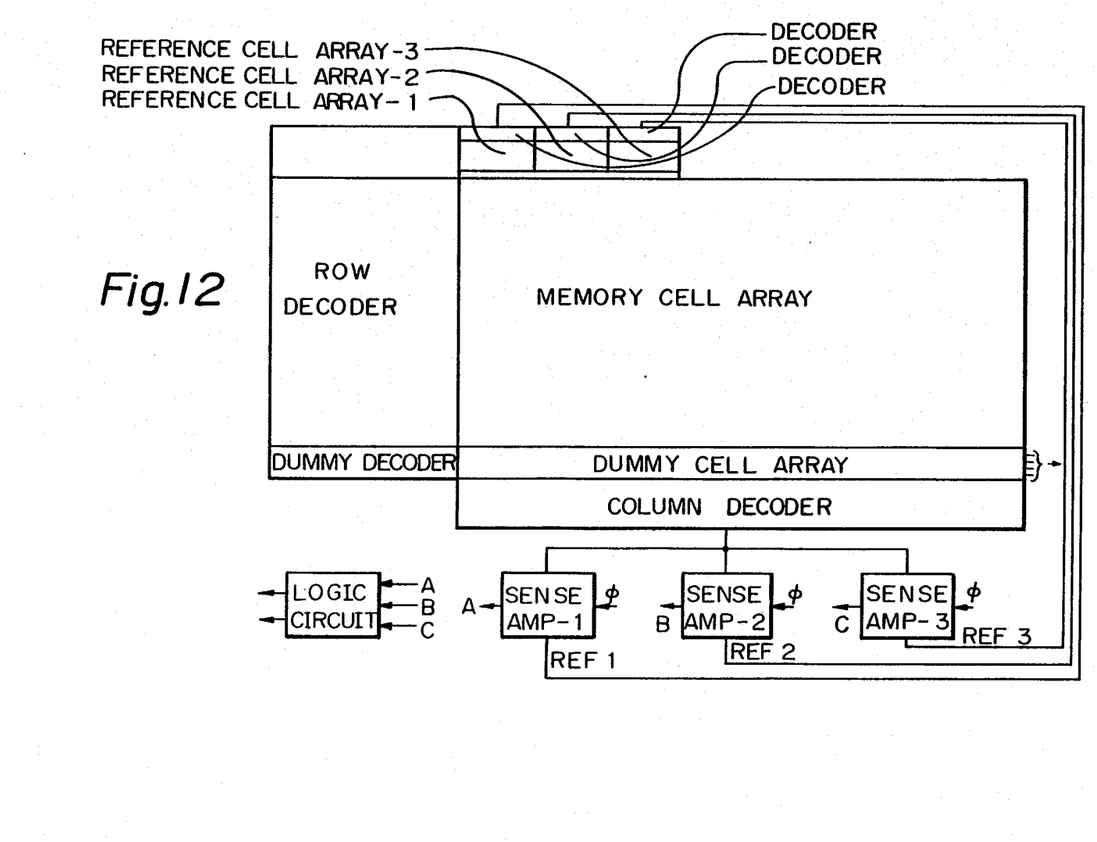
FIG. 12 shows an example of the arrangement of the plural-bit-per-cell ROM on an integrated circuit (IC) chip.

An example of the arrangement of the plural-bit-per-cell ROM on an IC chip is shown in FIG. 12. A memory cell array, dummy cell array, row decoder, dummy decoder, column decoder, reference cell array Nos. 1, 2, and 3, decoders for the reference cell array Nos. 1, 2, and 3, sense amplifier Nos. 1, 2, and 3, and logic circuit are provided in the arrangement shown in FIG. 12.

We claim:

1. A plural-bit-per-cell read-only memory having a memory cell array comprising a plurality of plural-bit read-only memory cells and reference cell arrays for producing reference voltages used for reading data stored in said plural-bit memory cells, said memory cell array comprising a plurality of parallel word lines, a pattern of diffusion layers formed on a substrate and extending in parallel with said word lines, a predetermined number of parallel bit lines crossing said diffusion layers per predetermined length of said diffusion layers, a plurality of plural-bit memory cells comprising a single transistor formed at the intersections of said bit lines and said word lines, and low resistance ground lines crossing said diffusion layers in parallel with said bit lines, one said low resistance ground line being arranged per said predetermined length of said diffusion layers, said predetermined length of said diffusion layers being used as a common grounding route to said ground line, said word lines forming the gates of said plural-bit memory cells, said bit lines and said word lines being used for the selection of an addressed cell from said plurality of plural-bit memory cells, and said reference cell array comprising a plurality of reference transistor cells, the arrangement of said reference cells in said reference cell array having positions corresponding to the arrangement of corresponding plural-bit memory cells within said predetermined length of said diffusion layers in said memory cell array, the transconductance of said reference cells being predetermined in correspondence with reference voltage values, a column address signal which selects a plural-bit memory cell also selecting a reference cell the position of which in its array corresponds to the position of said plural-bit memory cell in said memory cell array selected by said column address signal, whereby the generation of a reference voltage is carried out in which the voltage value of the selected reference cell reference voltage varies in the same manner as variations in voltage of the selected plural-bit memory cell, taking into consideration variation of resistance of said diffusion layers according to the location of said plural-bit memory cell selected by said column address signal.

* * * * *